(12) United States Patent
Spartiotis et al.

(10) Patent No.: US 8,117,741 B2
(45) Date of Patent: Feb. 21, 2012

(54) METHOD FOR MANUFACTURING A RADIATION IMAGING PANEL COMPRISING IMAGING TILES

(75) Inventors: Konstantinos Spartiotis, Espoo (FI); Pasi Laukka, Espoo (FI)

(73) Assignee: Oy AJAT Ltd, Espoo (FI)

( * ) Notice: Subject to any disclaimer, the term of this patent is extended or adjusted under 35 U.S.C. 154(b) by 0 days.

(21) Appl. No.: 12/419,528

(22) Filed: Apr. 7, 2009

(65) Prior Publication Data
US 2010/0255629 A1   Oct. 7, 2010

(51) Int. Cl.
*H05K 3/30* (2006.01)

(52) U.S. Cl. ............... 29/832; 29/739; 29/830; 29/834; 174/260; 361/760; 438/975

(58) Field of Classification Search ............ 29/830, 29/832, 834, 739; 174/260; 361/760; 257/797, 257/E23.179; 438/401
See application file for complete search history.

(56) References Cited

U.S. PATENT DOCUMENTS

| | | | |
|---|---|---|---|
| 4,891,522 A | 1/1990 | Coon | |
| 5,065,245 A | 11/1991 | Carnall, Jr. | |
| 5,391,881 A | 2/1995 | Jeuch | |
| 5,436,458 A | 7/1995 | Tran | |
| 5,464,984 A | 11/1995 | Cox | |
| 5,635,718 A | 6/1997 | DePuydt | |
| 6,034,319 A * | 3/2000 | Falbel | 136/246 |
| 6,163,028 A | 12/2000 | Orava | |
| 6,703,617 B1 | 3/2004 | Spartiotis | |
| 2002/0064252 A1 | 5/2002 | Igarashi et al. | |
| 2003/0164888 A1* | 9/2003 | Orava et al. | 348/308 |
| 2004/0120448 A1 | 6/2004 | Ratzmann | |
| 2005/0160972 A1 | 7/2005 | Cunningham | |
| 2005/0178971 A1 | 8/2005 | Hoge | |
| 2005/0205778 A1* | 9/2005 | Kitai et al. | 250/309 |
| 2006/0283011 A1* | 12/2006 | Muller et al. | 29/834 |
| 2008/0063139 A1* | 3/2008 | Pantsar et al. | 378/40 |
| 2009/0321013 A1 | 12/2009 | Pitault | |

FOREIGN PATENT DOCUMENTS

| | | |
|---|---|---|
| EP | 0933650 | 4/1999 |
| EP | 1986239 A2 | 10/2008 |
| GB | 2451447 A | 2/2009 |
| JP | 2007155565 | 6/2007 |
| WO | 9708751 A1 | 3/1997 |
| WO | 0065376 | 11/2000 |

(Continued)

OTHER PUBLICATIONS

Suss Microtec : "Infotonics select Suss bonding systems for MEMS development center", XP002584140, Retrieved from the internet: URL :http ://www.suss.com/company/news/ 2007/27-03-2007 on May 25, 2010.

(Continued)

*Primary Examiner* — Derris Banks
*Assistant Examiner* — Azm Parvez
(74) *Attorney, Agent, or Firm* — Young & Thompson

(57) ABSTRACT

An automatic or semiautomatic method of assembly of radiation digital imaging tiles to form a one or two dimensional imaging panel whereby the imaging tiles are provided with alignment mark(s), inherent or specific, and a mother board or substrate is also provide with alignment mark(s) and the imaging tiles are mounted on the mother board by means of mechanical pick and place mechanism, whereby the distances of corresponding alignment mark are set to predetermined values, programmed in the automatic machine.

13 Claims, 9 Drawing Sheets

FOREIGN PATENT DOCUMENTS

| | | |
|---|---|---|
| WO | 2004038810 | 5/2004 |
| WO | 2005029126 A1 | 3/2005 |

OTHER PUBLICATIONS

Spartiotis K et al: "A Photon counting CdTe gamma- and X-ray camera", Nuclear Instruments & Methods in Physics Research, Section-A: Accelerators, Spectrometers, Detectors and Associated Equipment, Sep. 11, 2005, pp. 267-277, vol. 550, No. 1-2, Elsevier, Amsteroam, NL LNKO001 :10.1016/ J .NIMA. 2005.04.081, XP025294725.

International Search Report in Corresponding Application No. PCT/IB2010/000301 dated Jun. 17, 2010.

* cited by examiner

METHOD FOR MANUFACTURING A RADIATION IMAGING PANEL COMPRISING IMAGING TILES

BACKGROUND OF THE INVENTION

The present invention relates to the field of manufacturing imaging panels for radiation (e.g., x-ray imaging panel for radiation of energy 5 keV or more). More specifically, the present invention relates to methods for manufacturing x-ray and gamma-ray imaging panels made of CdTe or CdZnTe imaging hybrids. A CdTe or CdZnTe imaging hybrid is an x-ray or gamma ray imaging device comprising a semiconductor substrate for converting x-rays/gamma rays to an electronic signal and a readout substrate (typically a CMOS or other Application Specific Integrated Circuit; "ASIC"). Constructing an array comprised of such hybrids is a complex task and involves tiling methods which aim at reducing the gap or inactive area between the hybrids (tiles). In any event, to this date such manufacturing methods involve a manual approach at positioning and fixing the hybrids on a mother board.

DESCRIPTION OF THE RELATED ART

CdTe and CdZnTe are well known to be x-ray imaging detectors of high sensitivity, which directly convert x-rays (or gamma rays) to electronic signal. Under the influence of an electric field the electronic signal is collected on pixel electrodes that are disposed on one face of the CdTe (or CdZnTe) detectors. Usually the detectors are bonded to a readout circuit which can be manufactured using conventional CMOS process or other ASIC processes (Application Specific Integrated Circuit: "ASIC"). The bonding technique is flip-chip bonding or in other words bump-bonding. This CdTe-ASIC structure (or CdZnTe-ASIC) is referred to as a hybrid, because it serves both as a detector (CdTe, CdZnTe) and as a readout (the ASIC). These hybrid imaging devices have excellent x-ray imaging capabilities and exhibit high sensitivity, high speed and high resolution. A typical active area, or field of view, of these hybrid devices is limited by the CdTe or CdZnTe semiconductor detectors and also the ASIC process. Typically CdTe-CMOS or CdZnTe-CMOS hybrids have an active area of few mm2 and up to few cm2. In one example of hybrids the CMOS readout has lead-out contact pads which are meant to be wired bonded onto a mother board, thus connecting the hybrid electrically to the mother board. These hybrids are referred to as three side buttable, because generally the space needed for wire bonding several millimeters. In another example the CMOS has via paths which route the lead signals of the CMOS from the pixel face to the opposite face of the CMOS. These hybrids are referred to as four side buttable because the lead wire pads are connected to the mother board through the backside of the CMOS (e.g., hybrids as disclosed in EP1554760). In the various applications fields, one needs larger active areas or active areas of different shapes. Therefore several hybrids (of any type) need to be combined using tiling techniques. Such tiling may be as simple as attaching the hybrids next to each other on a mother printed circuit board ("pcb"), or on a ceramic, or some interposer which is then mounted on a mother board or more complex tiling methods that aim at minimizing the gap between the tiles or minimizing the dead space created by the wire bonding pads that connect each hybrid to the PCB (in case of three side buttable hybrids). Such tiling methods are described in U.S. Pat. No. 6,163,028, U.S. Ser. No. 10/532, 119, U.S. Pat. No. 6,703,617, WO2004/038810, WO0065376, U.S. Pat. Nos. 5,464,984, 5,635,718, EP0933650, U.S. Pat. Nos. 4,891,522, 5,065,245, 5,391,881, 5,436,458, 5,635,718, JP2007155565.

The CdTe-CMOS hybrid technology (either three side or four side buttable) is fairly new and barely has entered the market. So far and in each case the assembly of the CdTe-CMOS or CdZnTe-CMOS hybrids on a mother board or other mounting surface (including interposer) is made, in the case of three side buttable hybrids, manually, typically involving an engineer positioning and assembling the hybrids on the mother board under a microscope. In the case of four side buttable hybrids the mounting is made using a flip-chip bonder which places the hybrids one by one and connects the lead-out contacts on the backside of the CMOS to corresponding contacts on the mother board or interposer. In either case (manually or using a flip-chip bonder) the hybrids are aligned to each other and the gap between the edges of the CdTe (or CdZnTe) detectors is minimized according to the general thinking that minimum gap between the CdTe (or CdZnTe) detectors would improve the image quality. Additionally the dicing accuracy of the CdTe (or CdZnTe) is not as good as that of the CMOS (or other ASICs), which necessitated a human eye observing the edges both the CdTe/CdZnTe as well the edges of the CMOS readout chip and the alignment between the hybrids, during the placement procedure.

However, it would be beneficial to minimize human labor making these CdTe-CMOS assembled panels. There is a need for manufacturing methods in assembling the CdTe-CMOS (or CdZnTe-CMOS) hybrids (of either type; i.e., both three side and four side buttable hybrids) to panels that would increase the manufactured volumes and keep the production cost low, as well as keeping good reliability of the assembled panels and have repeatable results.

SUMMARY OF THE INVENTION

The current invention is a method of automatic or semiautomatic manufacturing a radiation digital imaging panel, said panel comprising radiation imaging tiles, the method utilizing a computer controlled device and/or mechanical pick and place device, e.g., a robot mechanism or the like and comprising the steps of:
  a. providing radiation imaging tiles with structures thereon that act or can be used as tile alignment mark(s),
  b. placing a first or an initial radiation imaging tile on said panel, by setting the distances x1, y1 and and/or angle theta1 of alignment mark(s) on the radiation imaging tile with respect to corresponding panel alignment mark(s) on the panel or with respect to an absolute coordinate system, to predetermined values X1, Y1 and/or Theta1, and
  c. Placing on the panel automatically or semi-automatically additional radiation imaging tiles by setting the distances and/or angles (x2, y2, theta2), (x3, y3, theta3), . . . (xn, yn, theta_n) with respect to corresponding alignment mark(s) on
    i. the previous imaging tile each time, or
    ii. the first or initial imaging tile or
    iii. the panel
    to predetermined values (X2, Y2, Theta2), (X3, Y3, Theta3), . . . (Xn, Yn, Theta_n).

The panel can be a printed circuit board ("PCB"), or a ceramic or a mother board/mounting substrate. The radiation imaging tiles in the preferred embodiments are CdTe-CMOS or CdZnTe-CMOS hybrids.

In accordance with one aspect of the current invention, a manufacturing method for manufacturing radiation imaging panels (or devices) comprises Cd(Zn)Te-ASIC hybrids, said method utilizing a computer controlled device and/or mechanical pick and place device, e.g., a robot mechanism or the like and comprising the steps of:

(a) Providing more than one Cd(Zn)Te-ASIC hybrids,
(b) Providing each hybrid with some distinct alignment mark(s) visible by machine vision techniques, such alignment mark(s) provided either on the ASIC or on the Cd(Zn)Te detector,
(c) Placing a first Cd(Zn)Te-ASIC hybrid on a mounting board (or substrate) by means of a pick and place automatic or semiautomatic machine,
(d) Placing a second Cd(Zn)Te-ASIC hybrid on said mounting board(or substrate) by means of a pick and place automatic or semiautomatic machine, said second hybrid being aligned and positioned with the respect to said first hybrid utilizing said alignment marks on each hybrid and according to fixed predetermined X2, Y2 distances and/or angle Theta2, and
(e) Placing additional hybrids (3, 4, . . . n) by means of a pick and place automatic or semiautomatic machine, said additional hybrids aligned and positioned with respect to their respective previous hybrid utilizing the said alignment marks on the previous hybrid and according to a fixed predetermined (X3,Y3), (X4,Y4) . . . (Xn, Yn) distances and/or angles Theta3, Theta4, . . . Theta_n.

In accordance with another aspect of the current invention, a manufacturing method for manufacturing radiation imaging panels (or devices) comprises Cd(Zn)Te-ASIC hybrids, said method utilizing a computer controlled device and/or mechanical pick and place device, e.g., a robot mechanism or the like and comprising the steps of:

(a) Providing more than one Cd(Zn)Te-ASIC hybrids,
(b) Providing each hybrid with some distinct alignment mark(s) visible by machine vision techniques, such alignment mark(s) provided either on the ASIC or on the Cd(Zn)Te detector,
(c) Placing a first Cd(Zn)Te-ASIC hybrid on a mounting board(or substrate) by means of a pick and place automatic or semiautomatic machine, and
(d) Placing additional Cd(Zn)Te-ASIC hybrids (2, 3, . . . ) on said mounting board(or substrate) by means of a pick and place automatic or semiautomatic machine, said additional hybrids being aligned and positioned with the respect to said first hybrid utilizing said alignment marks on each hybrid and setting to a predetermined value the distances (x2, y2), (x3, y3), . . . (xn, yn) and/or angles theta_1, theta_2, theta_3, . . . theta_n.

In accordance with a third aspect of the current invention, a manufacturing method for manufacturing radiation imaging panels (or devices) comprises Cd(Zn)Te-ASIC hybrids, said method utilizing a computer controlled device and/or mechanical pick and place device, e.g., a robot mechanism or the like and comprising the steps of:

(a) Providing more than one Cd(Zn)Te-ASIC hybrids,
(b) Providing each hybrid with some distinct alignment mark(s) visible by machine vision techniques, such alignment mark(s) provided either on the ASIC or on the Cd(Zn)Te detector, and
(c) Placing Cd(Zn)Te-ASIC hybrids (1,2, . . . n) placed on a mounting board (or substrate) by means of a pick and place automatic or semiautomatic machine which positions the said alignment mark(s) of each hybrid to certain alignment mark(s) provided on the mounting board (or substrate), by setting the distances (x1, y2), (x2, y2), . . . (xn, yn) and/or angles Theta_1, theta_2, . . . theta_n to a predetermined value.

The alignment mark(s) on each ASIC maybe on the side of the pixels (mostly the case on three side buttable hybrids) or on the backside of the ASIC, i.e., the side that will be facing the mounting board (mostly the case on four side buttable hybrids)

Alternatively the alignment mark(s) for each hybrid may be provided on the CdTe or CdZnTe detector instead of the ASIC, but such is not a preferable approach since the accuracy achieved with ASIC design and manufacturing far exceeds that of CdTe or CdZnTe substrates.

The present inventive manufacturing method, preferably has the additional step of choosing a predetermined gap between each of the hybrids, such gap been measured between the edges of the CdTe or CdZnTe detectors or the ASIC edges. During the mounting process (c, d, e) the distance between the edges of the Cd(Zn)Te detectors is kept no less than 10 um and no larger than 2 pixel wide, but preferably approximately one pixel wide (±50 um). This ensures that the hybrids do not come in contact to each other which may cause an electric sort-circuit or break the semiconductor substrate. Having a gap in a tiled CdTe-CMOS or CdZnTe-CMOS panel is un-avoidable. However, in accordance with the current invention the method provides for a gap between the hybrids that contrary to instinctive thinking is not as small as possible but is as close as practically possible to one pixel size, which is the optimal for interpolating such gap without causing image distortion.

The predetermined distances (x1, y1), (x2, y2), . . . (xn, yn) and/or angles theta_1, theta_2, . . . theta_n are programmed into the automatic machine prior to commencing the manufacturing process and during the programming phase.

The current invention is not limited to Cd(Zn)Te detector hybrids but is exemplified best with such. Other detector choices such PbI, HgI, ThBr etc can be used. Additionally the semiconductor substrate does not need to be single crystal but may also be polycrystalline and may be connected to the ASIC through bump-bonding, conductive adhesives, epitaxial growth or other techniques.

DETAILED DESCRIPTION OF THE PREFERRED EMBODIMENTS

The invention and preferred embodiments are described with reference to the drawings.

Figure 1:
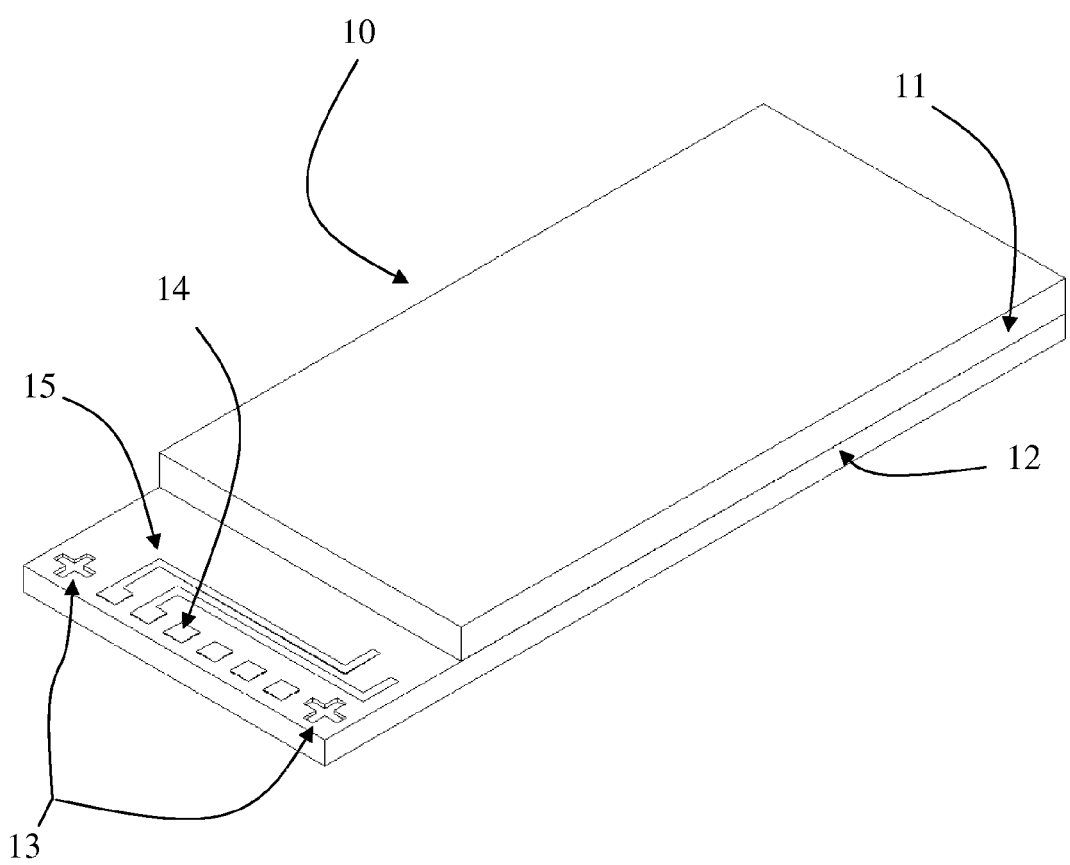
FIG. 1 shows schematically a three side buttable Cd(Zn)Te-CMOS hybrid including the alignment marks.

FIG. 1 depicts a three side buttable CdTe-CMOS or CdZnTe-CMOS hybrid (10). Such hybrid comprise the detector (11), which is CdTe or CdZnTe such detector for receiving incoming radiation and converting the received radiation directly to an electronic signal, and of the CMOS readout chip (12), for collecting, processing and reading out the electronic signal from each pixel. Although the described method of manufacturing is described with respect to automatic Cd(Zn)Te-CMOS hybrid assemblies into radiation imaging panels, the method is evident to anyone skilled in the art that one would not depart from the scope of the invention if he would use the disclosed automatic imaging tile manufacturing assembly method with other detector materials and other readout chip technologies, such detectors and readout chips making up the imaging tiles. For example other radiation direct conversion detectors could be Si, HgI, PbI, ThBr, Se, Ge, GaAs etc. Indirect conversion detectors would include these that engage a phosphor or scintilator screen to convert radiation to light, such for example being NaI and the like. As a readout chip one can use an ASIC (Application Specific Intergarted Circuit), based on CMOS technology, Bi-CMOS or other integrated circuit technologies. The readout chip could also be a CCD (Charged Coupled Device)or one based on miniature (small sized) flat panel technology (Thin Film Transistor arrays), utilizing a-Si arrays. The disclosed placement is achieved with a computer controlled device and/or mechanical pick and place device, e.g., a robot mechanism or the like in order to avoid the prior art manual approach and to achieve the desired accuracy.

Coming back to FIG. 1, the readout CMOS (12) is provided with alignment or fiducial marks (13) and also has ordinarily wire bonding pads (14), power lines (15) etc. These elements (13), (15), (14) will be used for precisely aligning the readout CMOS with respect to the mounting board with references to the following steps of the panel manufacturing method. The marks, and fiducial that can be used for the purpose of aligning accurately the hybrid, can be choosen from a number of structures on the CMOS some of which can be functional structures such as the power lines (15), wire bonding pads (14) or any other structures that are positioned accurately and are repeatable on each hybrid that will be used to make up the imaging panel. Preferably, the accuracy of such marks or structures should be 10 um or better, even more preferably 5 um or better and even more preferably 1 um or better. In any event, the accuracy of the alignment marks or structures must be better than the desired accuracy of the placement of the hybrid on the imaging panel.

Figure 2:
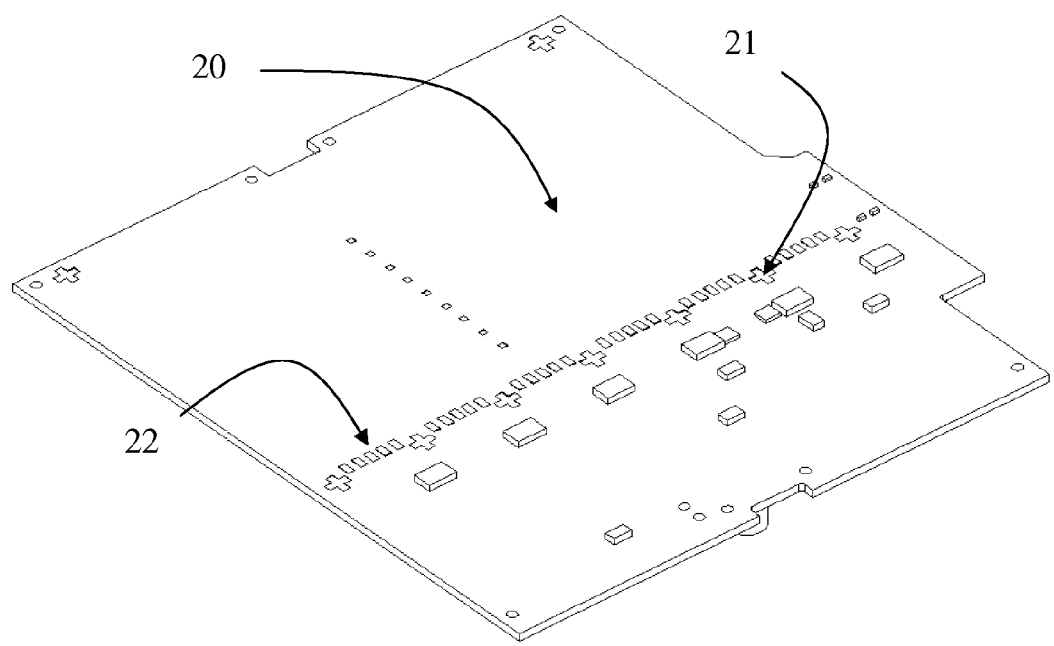
FIG. 2 shows schematically a panel comprising a mounting board onto which the hybrids are to be placed by means of the invented manufacturing method FIGS. 3a, b, c, d shows schematically a first hybrid placed on a mother printed circuit board (or mounting substrate or equivalent mother board of a different material or type) and a second and additional hybrids been placed in accordance with three preferred embodiments of the disclosed automatic or semiautomatic manufacturing method.

FIG. 2 depicts the mother board onto which the hybrids (i.e., imaging tiles) will be mounted by means of the disclosed automatic manufacturing method. The mother board (20) is typically a Printed Circuit Board most commonly an "FR4" PCB. Other mother boards can be made of ceramic materials or other suitable materials on which imaging tiles can be placed. The mother board is provided with corresponding wire bonding pads (22) that will electrically connect the circuits and electronics of the PCB to the readout CMOS'es (12) of FIG. 1. Additionally the PCB (20) has alignment marks (21) which will be used to first align the PCB in an absolute coordinate system of the automatic machine, and then consequently will be used to provide alignment with respect to the tiles.

These alignment marks (21) need not be specifically implemented for the purpose of alignment, but they can be any accurate structure on the PCB (or mother board in general). For example as alignment marks one can use some components on the PCB, some lines, some power lines, some edge (s), or metal plated parts etc. Basically any structure, geometry or part on the PCB (or mother board) that can be recognized and used as an alignment mark can be used for this purpose, but here for convenience in making the darwing we have indicated such with a cross (21).

The alignment procedure of the PCB with respect to the coordinate system of the automatic hybrid placing machine as well as the alignment procedure of the hybrid with respect to the PCB is based on vision and computer based pattern recognition. This means that the alignment marks of the PCB (or mother board) are inspected by a camera or lens system of some sort on the machine and then commercially available pattern recognition software will identify that these are indeed the user selected alignment marks and then compare the coordinates of the visually recognized alignment marks to the coordinate system of the machine. Then automatically correction will be made in the X,Y horizontal plane so that the PCB has some absolute position with respect to the coordinate system of the automatic hybrid placing machine. Once the PCB is thus aligned and positioned accurately inside the machine, then the hybrids (imaging tiles) can be placed as well by using the same pattern recognition software which identifies the specific marks on the hybrid(s) and matches them to corresponding marks on the PCB. The corresponding marks on the PCB do not need to have the same shape or size.

FIGS. 3a, 3b, 3c, 3d explain how the automatic placement of the Cd(Zn)Te-CMOS hybrids is made, i.e., the method by which automatically one is able to place imaging tiles on a mother board (or a substrate) and create thus an imaging panel. The benefit of doing this assembly automatically is that the throughput is far better than what one would achieve by manual placement under the microscope and secondly the accuracy, repeatability and reliability of the placements is far better than what one would achieve by manual methods.

Figure 3A:
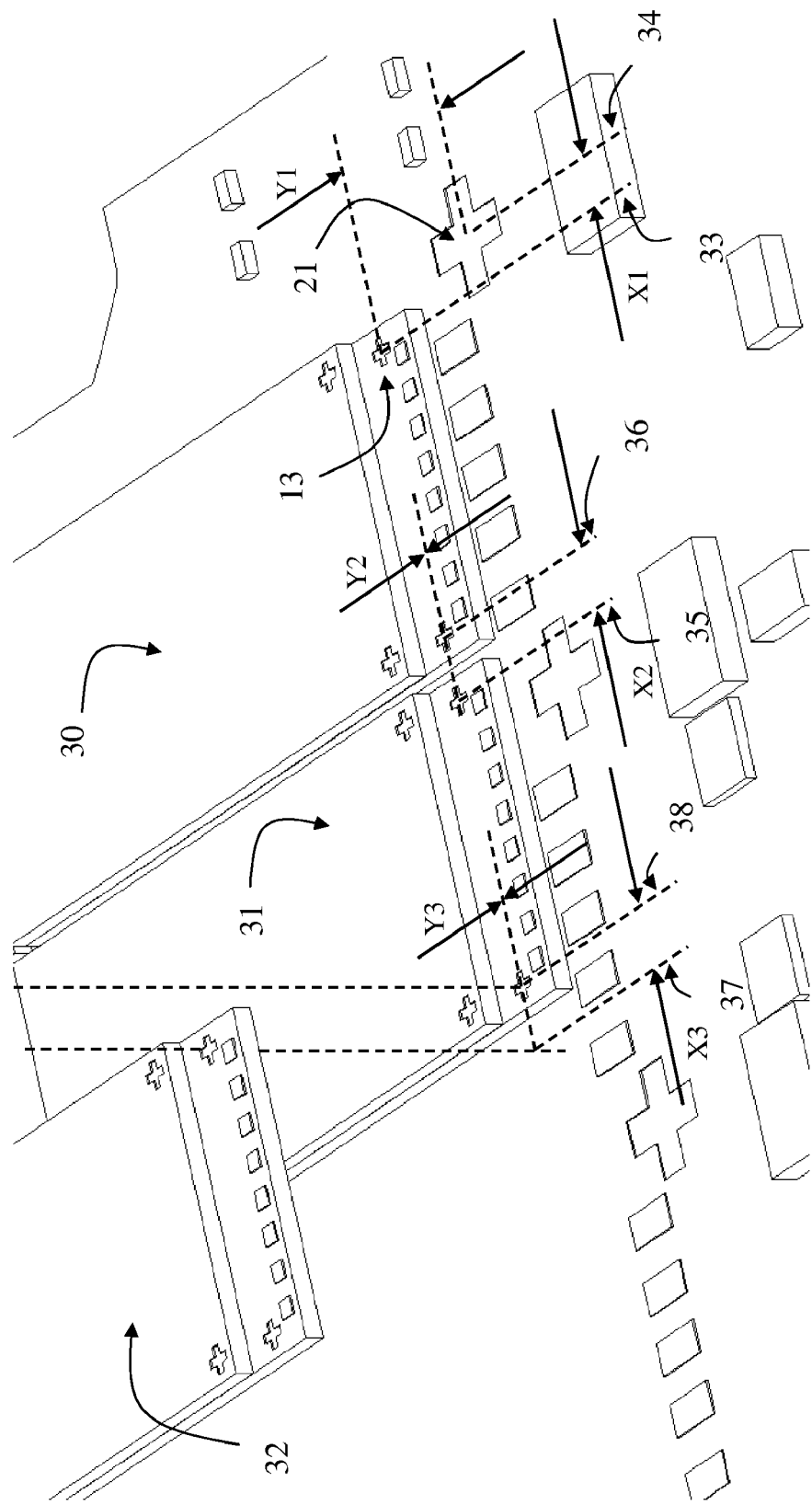

In FIG. 3a, there is a mother board or a substrate of some sort (for example a mother board (20) as shown in FIG. 2), onto which the Cd(Zn)Te-CMOS hybrids are to be placed. The mother board is provided with alignment mark(s) (21). However, as alignment marks one should understand any structures on the mother board that can be used for the purpose of alignment and such can be wire pads, electronic components, gold or platinum plated areas or edges, power lines etc. FIG. 3a also shows by way of example three hybrids (30), (31), (32). Each hybrid is provided with alignment mark (s) (13) corresponding to alignment marks (21) on the mother board (20). The alignment marks can be provided, as can be seen, either on the CMOS (readout chip) or on the detector. In case one uses alignment marks on the CMOS, such could also be the wire pads, electronic structures, power lines etc.

In one preferred embodiment of the current invention a first hybrid (30) is being placed automatically on the mother board using machine vision measuring the distances x1, y1 between the alignment marks on the hybrid and the mother board and also the angle theta1 between (33) and (34) which defines the parallelism of the hybrid (30) with respect to the mother board alignment position and setting such distances to predetermined values X1, Y1 and the angle theta1 to predetermined value Theta1. For example as is depicted in FIG. 3a, Theta1 is equal to zero degrees and dotted line (33) is parallel to (34). The first hybrid (also in embodiments of FIGS. 3b, 3c) can also be placed utilizing an absolute coordinate system of the machine and setting x1, y1, theta1 to certain predetermined values. The accuracy that can be achieved in the positioning is better than 0.1 mm and can be as good as or better than 0.01 mm. FIG. 3d shows a non-zero theta, in which case the tile would not be aligned properly.

In a second step a second hybrid (31) is positioned by measuring the distances x2, y2 and angle theta2 between (35)

and (36) of the second hybrid alignment marks with respect to the first hybrid alignment marks. These distances are set to predetermined values X2, Y2, the angle to a predetermined value Theta2 (equal to zero in this example) and the hybrid (31) is placed in that location. In a third step a third hybrid (32) is placed by measuring the distances x3, y3 and the angle theta3 between (37) and (38) of the third hybrid alignment marks with respect to the second hybrid alignment marks, i.e., the previous hybrid. These distances are set to predetermined values X3, Y3 and Theta3 (equal to zero in this example) and the hybrid is placed on the location. Additional hybrids (4, 5, . . . n) can be placed using the same method, constructing eventually a one or two dimensional array of imaging tiles (hybrids) placed on mother board, or a substrate.

Figure 3B:
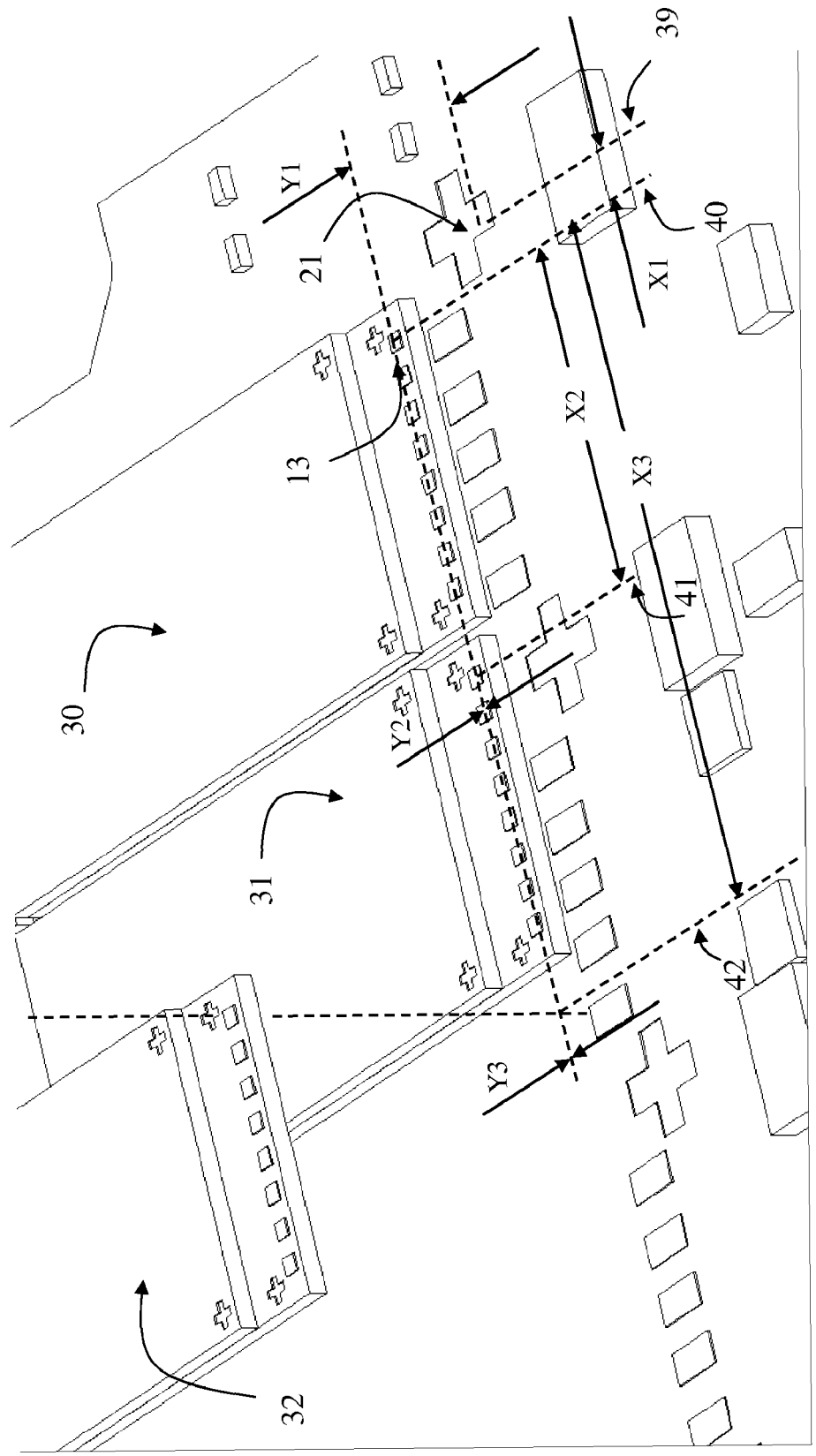

In FIG. 3b, there is a mother board or a substrate of some sort (for example a mother board (20) as shown in FIG. 2), onto which the Cd(Zn)Te-CMOS hybrids are to be placed in accordance with another aspect of the current invention. The mother board is provided with alignment mark(s) (21). However, as alignment marks one should understand any structures on the mother board that can be used for the purpose of alignment and such can be wire pads, electronic components, gold or platinum plated areas or edges, power lines etc. FIG. 3b also shows by way of example three hybrids (30), (31), (32). Each hybrid is provided with alignment mark(s) (13). The alignment marks can be provided, as can be seen, either on the CMOS (readout chip) or on the detector. In case one uses alignment marks on the CMOS, such could also be the wire pads, electronic structures, power lines etc. In this second preferred embodiment of the current invention a first hybrid (30) is being placed automatically on the mother board using machine vision measuring the distances x1, y1 and angle theta1 (between (39) and (40)) between the alignment marks on the hybrid and the mother board and setting such distances to predetermined values X1, Y1 and Theta1 (in this example zero). The accuracy that can be achieved is better than 0.1 mm and can be as good as or better than 0.01 mm.

In a second step a second hybrid (31) is positioned by measuring the distances x2, y2 and angle theta2 (between (41) and (40)) of the second hybrid alignment marks with respect to the first hybrid alignment marks. These distances are set to predetermined values X2, Y2 and angle Theta2 (in this example zero) and the hybrid (31) is placed in that location. In a third step a third hybrid (32) is placed by measuring the distances x3, y3 and angle theta3 (between (42) and (40)) of the third hybrid alignment marks with respect to the first hybrid alignment marks, i.e., the initial hybrid (30). These distances are set to predetermined values X3, Y3 and angle Theta3 (in this example zero) and the hybrid is placed on the location. Additional hybrids (4, 5, . . . n) can be placed using the same method, constructing eventually a one or two dimensional array of imaging tiles (hybrids) placed on mother board, or a substrate.

Figure 3C:
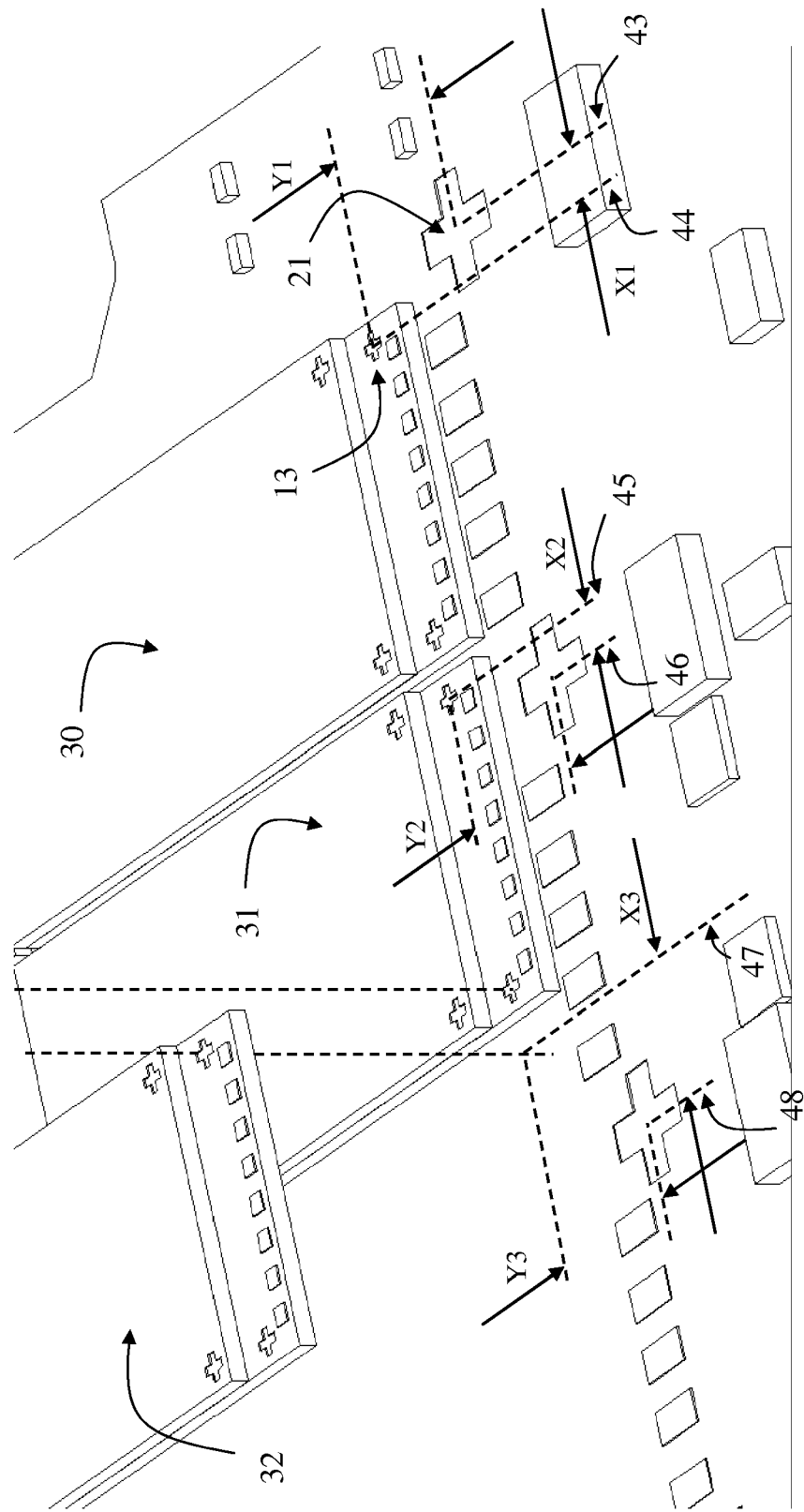
Figure 3D:
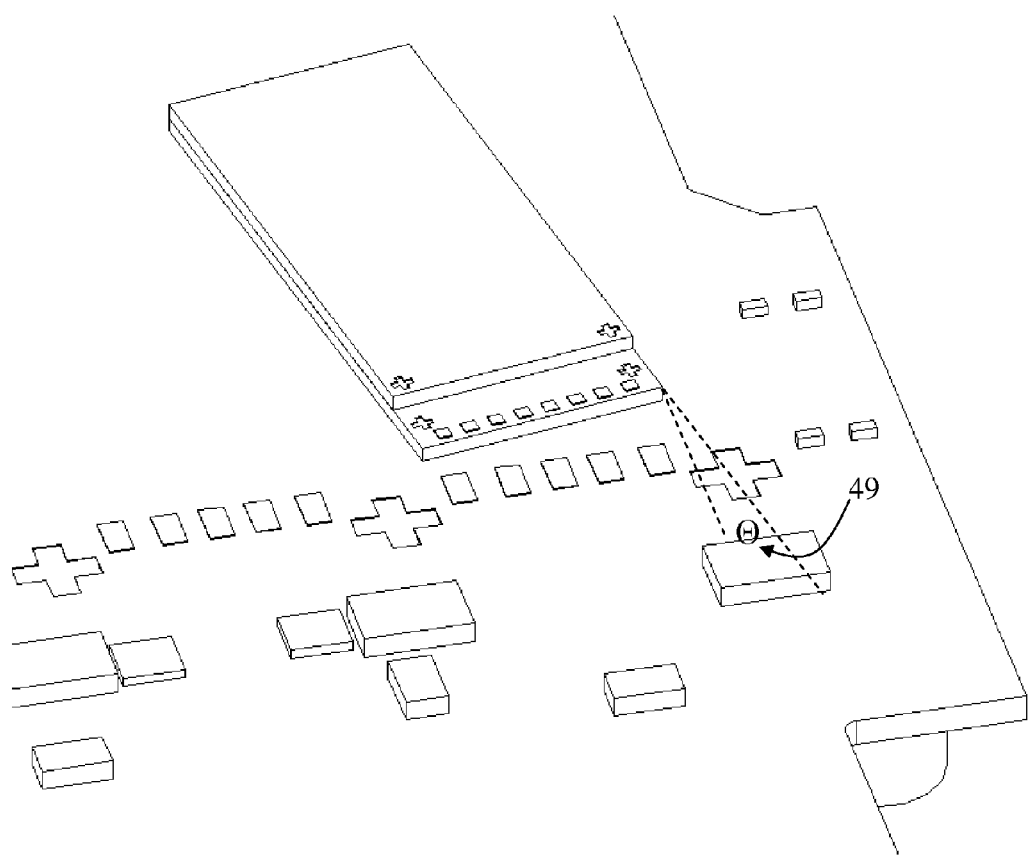

In FIG. 3c, there is a mother board or a substrate of some sort (for example a mother board (20) as shown in FIG. 2), onto which the Cd(Zn)Te-CMOS hybrids are to be placed in accordance with a third aspect of the current invention. The mother board is provided with alignment mark(s) (21). However, as alignment marks one should understand any structures on the mother board that can be used for the purpose of alignment and such can be wire pads, electronic components, gold or platinum plated areas or edges, power lines etc. FIG. 3c also shows by way of example three hybrids (30), (31), (32). Each hybrid is provided with alignment mark(s) (13). The alignment marks can be provided, as can be seen, either on the CMOS (readout chip) or on the detector. In case one uses alignment marks on the CMOS, such could also be the wire pads, electronic structures, power lines etc.

In this third preferred embodiment of the current invention a first hybrid (30) is being placed automatically on the mother board using machine vision measuring the distances x1, y1 and angle theta1 (between (43) and (44)) between the alignment marks on the hybrid and the mother board and setting such distances to predetermined values X1, Y1 and angle Theta1 (in this example zero). The accuracy that can be achieved is better than 0.1 mm and can be as good as or better than 0.01 mm.

In a second step a second hybrid (31) is positioned by measuring the distances x2, y2 and angle theta2 (between (46) and (45)) of the second hybrid (31) alignment marks with respect to corresponding alignment marks on the mother board (20) (or a substrate). These distances are set to predetermined values X2, Y2 and angle Theta2 (in this example zero) and the hybrid (31) is placed in that location. The corresponding alignment marks on the mother board, which can be seen in FIG. 3c, preferably are proximate to the hybrid that is being placed, so as to achieve optimal placement accuracy. Alternatively the mother board alignment mark(s) can also be common to all hybrids, e.g., it can be the alignment mark(s) (21) that was/were used for the first hybrid (30).

In a third step a third hybrid (32) is placed by measuring the distances x3, y3 and angle theta3 (between (48) and (47)) of the third hybrid alignment marks with respect to corresponding alignment marks on the mother board (20) (or a substrate). These distances are set to predetermined values X3, Y3 and angle Theta3 (in this example zero) and the hybrid is placed on the location. Additional hybrids (4, 5, . . . n) can be placed using the same method, constructing eventually a one or two dimensional array of imaging tiles (hybrids) placed on mother board, or a substrate.

In all the preceding example embodiments, the angle theta1, theta2, . . . theta_n may be used as one alignment parameter or not depending on the automatic program one wants to achieve. As mentioned the accuracy one achieves in the hybrid automatic placement with the disclosed method embodiments is very good and can easily be 0.1 mm or better and if needed 0.05 mm or better or 0.01 mm or better and in cases where extreme accuracy is needed 0.001 mm. Repeatability and reliability is also excellent and cannot be matched with manual imaging tile assembly techniques used in the prior art to this date. A computer controlled device and/or mechanical pick and place device, e.g., a robot mechanism or the like is used to pick and place the hybrids to these locations. Prior to picking and placing a dispensing arm will place drop(s) of glue on the locations where corresponding hybrids will be mounted.

In accordance therefore with these preferred embodiments hybrids are being placed on the mother board or mounting substrate automatically, by measuring the distances of alignment mark(s) provided or being present on each hybrid with respect to corresponding alignment mark(s) on a) the previous hybrid each time, or b) the first or initial hybrid or c) the mother board (or mounting substrate), and setting distances to predetermined values that have been programmed in the machine.

This method of assembly is particularly useful with CdTe-CMOS or CdZnTe-CMOS radiation imaging hybrids, but other detector materials (such as phosphor or scintillating screen, e.g., NaI etc) and other readout chips can be used (such as CCD (Charged Coupled Device) or TFT (Thin Film Trasistor) readout chips). The end result is a one or two dimensional array of imaging tiles that form a larger area active imaging device.

Utilizing the disclosed method of manufacturing radiation imaging panels, the throughput is greatly enhanced over manual methods of picking and placing the imaging tiles under a microscope, and reliability and repeatability are greatly improved while the cost of production is reduced significantly.

Figure 4:
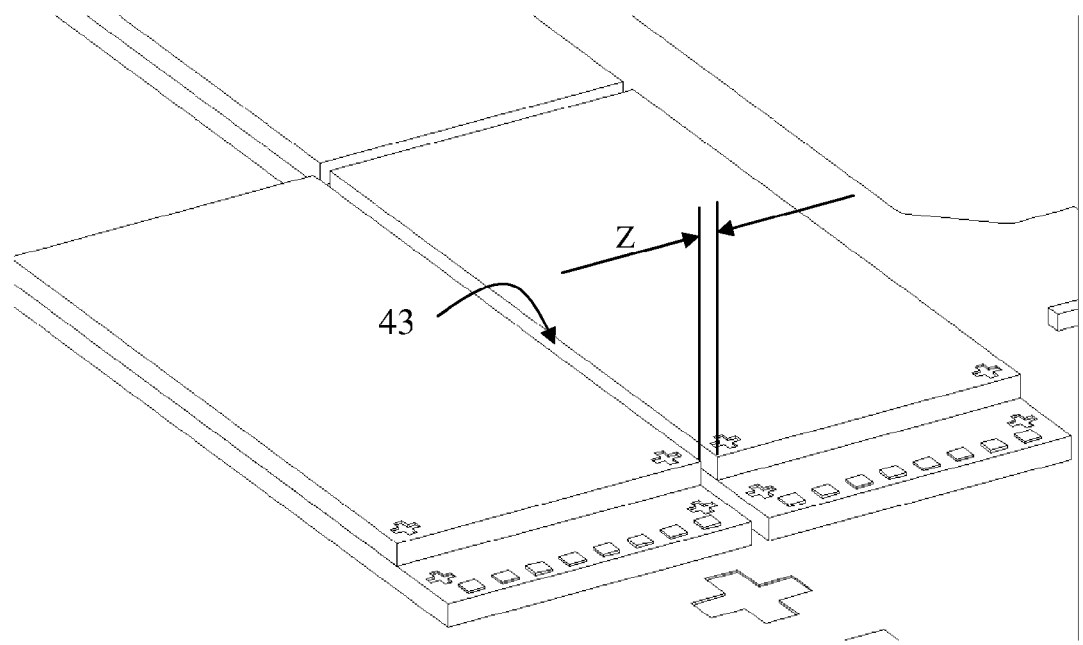
FIG. 4 shows schematically a detail of hybrids placed on a mother board in accordance with the invented automatic or semiautomatic manufacturing method.

FIG. 4 shows schematically CdTe-CMOS hybrids assembled in accordance with the current automatic assembly method on a mother board, or mounting substrate. Of importance in FIG. 4, is that counter to intuition, there is a gap "Z" (43) between the edges of adjacent hybrids. Intuitively one would want to minimize such gap, so that there is minimum information lost during imaging because of the gap. However, the inventors of the current assembly method have recognized that if one would minimize such gap "Z" (43) and in fact the edges of the CdTe-CMOS hybrids come into contact, then the performance of the imaging assembly is degraded. This is due to the fact that: a) CdTe is fragile and any contact would cause damage to the edges, b) touching edges would create an electric sort circuit which could damage the CMOS or other electronics, c) the electric field uniformity is affected. Therefore in accordance with another aspect of the current invention of automatic method of assembly of imaging tiles in an one or two dimensional imaging format panel, the physical gap "Z" (43) between the edges of the active detector elements (whether CdTe, CdZnTe, phosphors, scinitilattors or other detectors) should be at least at least 1/20 the pixel size and the maximum gap should not be more than 1.2×pixel size, that is, the maximum gap should not exceed the pixel size plus 20%.

Pixel size is the size of the pixel(s) on the imaging tile. A pixel size is the center to center or edge to edge distance of individual detecting or imaging elements on the imaging tile or imaging hybrid. Currently pixel size is between 0.025 mm and 0.5 mm (i.e., 25 micrometers to half a millimeter). The invention, however, applies to pixels of any size. The invention provides the gap be in the range from 1/20 the pixel to 1.2×pixel size, thus ensuring proper separation of the individual imaging tiles.

Figure 5:
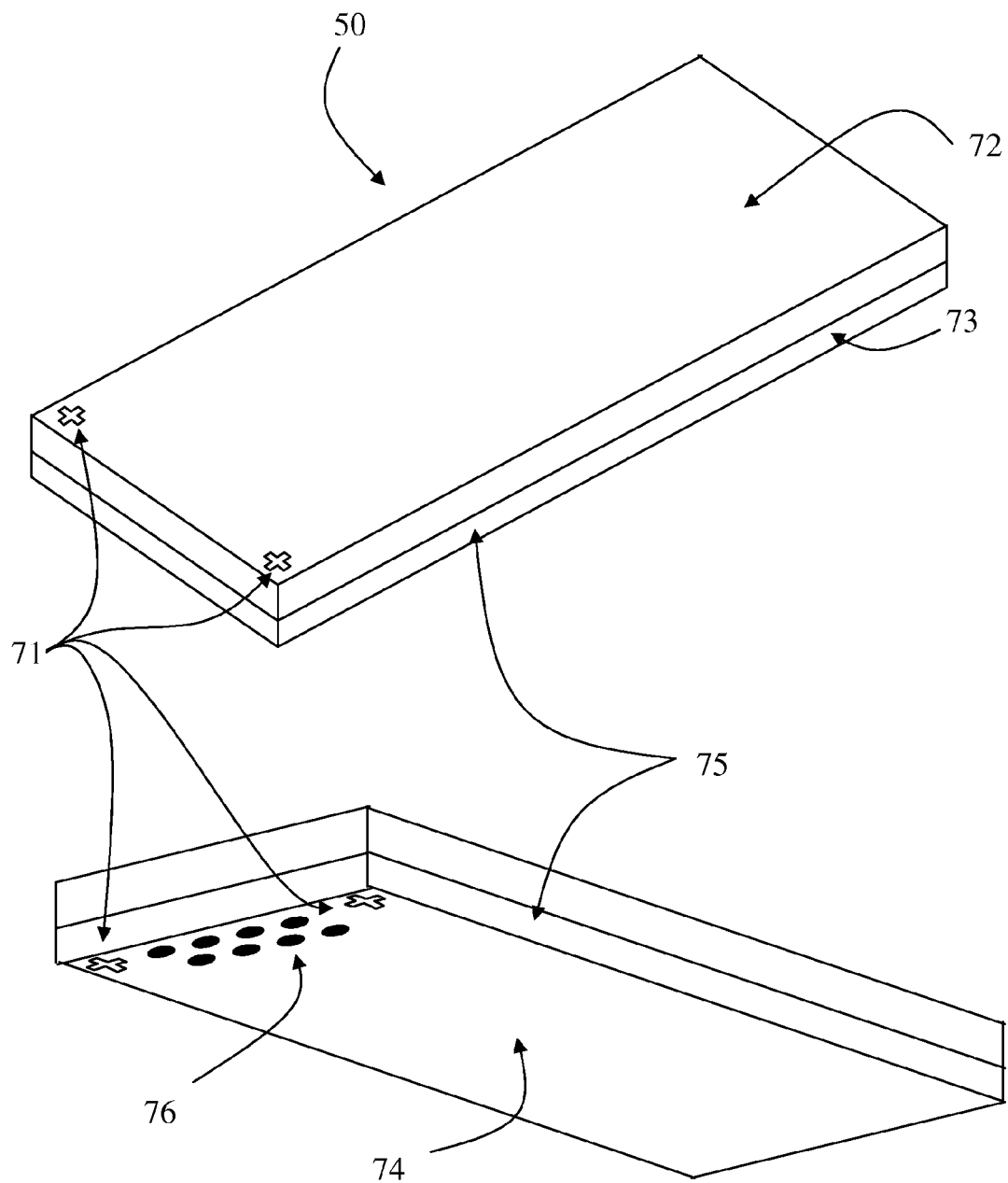
FIG. 5 shows a four side buttable hybrid which has in accordance with the current invention the alignment marks provided on the entry face of the CdTe or CdZnTe detector substrate or on the back face of the corresponding ASIC.

FIG. 5 shows schematically a CdTe-CMOS (or CdZnTe-CMOS) hybrid without the wire bonding pads (14) of FIG. 1, but instead electric connection points (76) provided on the backside (74) of the CMOS (75). These connections may be provided on the CMOS by means of "via" technology that connects electrically the cisruit elements in the front side of the CMOS to the backside (74). The CdTe detector (73) is bump-bonded to the CMOS or bonded by means of conductive adhesive. The hybrid (50) is provided with alignment marks (71) which as can be seen in FIG. 5 may be on either the front side (72) of the detector (73) or on the backside (74) of the CMOS (75). Such alignment marks can be of different shapes and can also be structures that are available on the surfaces (72) or (74), such as guard rings, power lines, electrical contact/connection points, etc.

Figure 6:
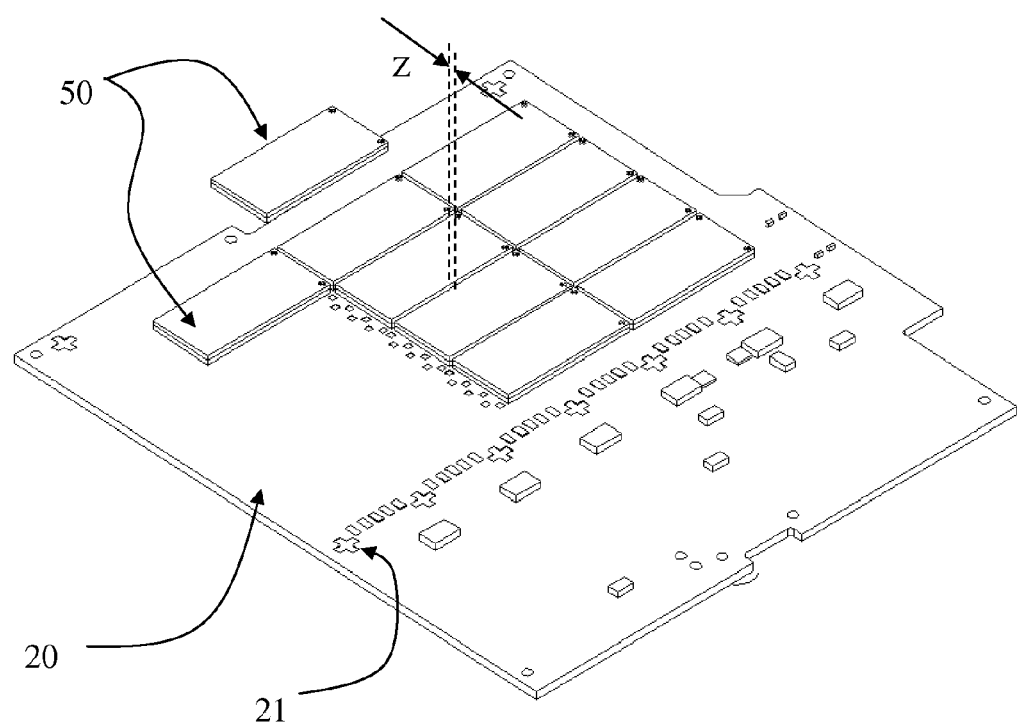
FIG. 6 shows schematically hybrids been placed in accordance with the current automatic or semiautomatic manufacturing method in a four side buttable configuration.

FIG. 6 shows schematically the assembly of the four-side buttable hybrids (50) of FIG. 5 onto the mother (20), utilizing the automatic or semiautomatic assembly method described earlier with reference to FIGS. 3(a-c). In FIG. 6, the gap "Z" between adjacent hybrids is also shown and exemplified and as described earlier such should be non-zero and preferably in the range from 1/20 through 1.2×the pixel sixe, more preferably through approximately the size of one pixel (1.0×the pixel size).

Although certain embodiments have been described to exemplify the benefits of the current invention, one may use different embodiments and/or materials for the imaging tiles without departing from the scope of the disclosure.

What we claim is:

1. A method of manufacturing a radiation digital imaging panel, comprising the step of:
   a mechanical pick and place device referencing a first tile alignment mark (13) on a first radiation imaging tile to a first board alignment mark (21) on a mother board, the mechanical pick and place device setting the first radiation imaging tile on the mother board with the first tile alignment mark (13) offset from the first board alignment mark (21) by a first predetermined distance in a first direction (x1) and by a first predetermined distance in a second direction (y1) based on said referencing.

2. The method of claim 1, comprising the further step of the mechanical pick and place device setting a second radiation imaging tile with a second tile alignment mark (13) on the mother board by the mechanical pick and place device positioning the second radiation imaging tile with the second tile alignment mark (13) offset from a reference alignment mark by a second predetermined distance in the first direction (x1), by a second predetermined distance in the second direction (y1) by referencing the second tile alignment mark (13) to the reference alignment mark.

3. The method of claim 2, wherein the reference alignment mark is the first board alignment mark (21) located on the mother board.

4. The method of claim 2, wherein the reference alignment mark is a second alignment mark (21) located on the mother board.

5. The method of claim 2, wherein the reference alignment mark is located on the first radiation imaging tile.

6. The method of claim 2, comprising the further step of the mechanical pick and place device setting a third radiation imaging tile with a third tile alignment mark (13) on the mother board by the mechanical pick and place device positioning the third radiation imaging tile with the third tile alignment mark (13) offset from another reference alignment mark by a third predetermined distance in the first direction (x1), by a third predetermined distance in the second direction (y1).

7. The method of claim 6, wherein the other reference alignment mark is located on the first radiation imaging tile.

8. The method of claim 6, wherein the other reference alignment mark is located on the second radiation imaging tile.

9. The method of claim 2, wherein the mechanical pick and place device, from referencing the first tile alignment mark (13) to the first alignment mark (21), sets the first radiation imaging tile on the mother board with the first tile alignment mark (13) offset from the first board alignment mark (21) by a predetermined angle (theta).

10. The method of claim 1, wherein the mother board comprises one of a printed circuit board, a ceramic substrate, and a mounting substrate.

11. The method of claim 2, wherein the first and second radiation imaging tiles comprises one of a CdTe-CMOS hybrid and a CdZnTe-CMOS hybrid.

12. The method of claim 11, wherein the mechanical pick and place device further spaces the second radiation imaging tile offset apart from the first radiation imaging tile by a first non-zero spacing distance (z_n) between adjacent nearest edges of the first and second radiation imaging tiles.

13. The method of claim 11, wherein the mechanical pick and place device further spaces the second radiation imaging tile offset apart from the first radiation imaging tile by a first non-zero spacing distance (z_n) between adjacent nearest edges of the first and second radiation imaging tiles, the non-zero spacing distance from 1/20 through one pixel size.

* * * * *